United States Patent
Bezinge et al.

(10) Patent No.: US 6,191,578 B1
(45) Date of Patent: Feb. 20, 2001

(54) MAGNETORESISTIVE SENSOR FOR HIGH PRECISION MEASUREMENTS OF LENGTHS AND ANGLES

(75) Inventors: Alex Bezinge, Yens; Jean-Luc Bolli, Genève, both of (CH)

(73) Assignee: Brown & Sharpe Tesa S.A., Renens (CH)

(*) Notice: Under 35 U.S.C. 154(b), the term of this patent shall be extended for 0 days.

(21) Appl. No.: 09/073,792

(22) Filed: May 7, 1998

(30) Foreign Application Priority Data

May 9, 1997 (EP) .................................................. 97810290

(51) Int. Cl.[7] ....................................................... G01B 7/14
(52) U.S. Cl. ................................ 324/207.21; 324/207.12; 324/252; 338/32 R
(58) Field of Search ............................... 324/326, 207.21, 324/207.12, 207.19, 207.24, 207.25, 252, 690; 356/72; 366/113

(56) References Cited

U.S. PATENT DOCUMENTS

| | | | |
|---|---|---|---|
| 4,319,188 | * 3/1982 | Ito et al. ............................... | 324/173 |
| 4,594,548 | * 6/1986 | Takahashi et al. .................... | 324/208 |
| 4,845,456 | 7/1989 | Abe et al. ............................ | 338/32 |
| 5,036,276 | * 7/1991 | Aizawa ............................ | 324/207.21 |
| 5,055,786 | * 10/1991 | Wakatsuki et al. .................. | 324/252 |
| 5,521,501 | * 5/1996 | Dettman et al. ...................... | 324/252 |

FOREIGN PATENT DOCUMENTS

| | | |
|---|---|---|
| 4208927 | 9/1992 | (DE) . |
| 4233331 | 4/1994 | (DE) . |
| 0554518 | 8/1993 | (EP) . |
| 0624778 | 11/1994 | (EP) . |
| 0784199 | 7/1997 | (EP) . |

OTHER PUBLICATIONS

F. Dettmann and U. Loreit, "Magnetoresistive Sensors, . . . ", Dortmund, Germany, Jun. 25, 1992, pp. 2–9.

* cited by examiner

*Primary Examiner*—Christine K. Oda
*Assistant Examiner*—Subhash Zaveri
(74) *Attorney, Agent, or Firm*—Jacobson, Price, Holman & Stern, PLLC

(57) ABSTRACT

A sensor for measuring linear or angular dimension. The sensor can be moved with respect to a magnetized scale with a period λ. It is equipped with magnetoresistive electrodes provided with barber-pole structures and connected so as to form n measuring bridges, each measuring bridge formed by four sets of magnetoresistive electrodes.

The magnetoresistive electrodes making up each set are connected in series, the magnetoresistive electrodes being distributed spatially so as to constitute x groups. Each group being formed by more than eight consecutive magnetoresistive electrodes coming from two sets of a same measuring bridge.

20 Claims, 5 Drawing Sheets

MAGNETORESISTIVE SENSOR FOR HIGH PRECISION MEASUREMENTS OF LENGTHS AND ANGLES

TITLE OF THE INVENTION

Magnetoresistive Sensor for Measuring Dimension

BACKGROUND OF THE INVENTION

Field of the Invention

This invention relates to a magnetoresistive sensor, and a device for measuring dimensions including such a sensor. More specifically, the invention relates to the placement of magnetoresistive electrodes in a magnetoresistive sensor.

Electronic devices for measuring length or angular position used in industry, for example, generally have to satisfy several constraints, some of them contradictory. They must provide sufficient precision and resolution, and be able to be used in environments subjected to vibrations and to pollution such as from dust, oil or humidity. Also expected of these sensors is that they can be easily incorporated into apparatus of small volume, without big adjustments or adaptations, while having a high speed of measurement and an electricity consumption as low as possible.

Different types of measuring devices, based on different principles, have been used to fulfill these diverse requirements. In particular, measuring systems using variations in capacity caused by the displacement of a sensor with respect to a scale have been widely used in particular in portable devices such as calipers, for example. These devices must be kept sufficiently clean to function and are thus badly suited to functioning in a humid environment or an environment subjected to splashes of lubricant or oil, for example. Devices for measuring length based on the principle of magnetoresistive electrodes have been proposed, for example in the patent DE 4233331 (IMO), which offer much better resistance to soiling. The device describe din this document comprises a sensor equipped with an array of magnetoresistive electrodes connected so as to define two measuring bridges. The electrodes are disposed and connected in such a way that all the paths are to be found in the same plane, i.e. no crossing of paths is necessary. The sensor is mounted on a slide and can be moved opposite a magnetized scale with a period of magnetization $\lambda$. The magnetoresistive electrodes of the sensor are spread over a length equal to two periods of the scale. A displacement of the sensor opposite the scale causes a modification of magnetic field applied to the various magnetoresistive electrodes of the sensor, and thus a modification of their resistance. By putting the measuring bridges under tension, an electric signal is received at their output which is a periodic function of the position of the sensor along the scale.

The two measuring bridges are made up of four magnetoresistive electrodes phase-shifted by $\lambda/2$. The corresponding electrodes of each bridge occupy positions phase-shifted by $\lambda/4$. The electrodes of the two bridges are intermixed. This document suggests moreover the use of barber-pole structures. The general theory of barber-pole structures has been explained by F. Dettmann and U. Loreit during the symposium "Magnetoresistive Sensoren, Grundlagen, Herstellung, Anwendung" (Magnetoresistive Sensors, Fundamentals, Production, Application), which was held in Dortmund, Germany, on Jun. 25, 1992. The barber-pole structures are obtained by applying on the magnetoresistive electrodes fine, parallel bands of conducting material inclined by about 45° with respect to the axis of the electrodes. These conducting bands are equipotential lines; between the bands the current takes the shortest path and thus flows with an inclination of 45° with respect to the axis of the magnetoresistive electrodes. This structure allows the direction of vector of current I to be changed. Since the resistance of a magnetoresistive electrode is a function of the angle between the magnetization vector and the current vector, the barber-pole structures allow control of the direction and of the amplitude of the variation in resistance of the electrodes caused by the displacement of the sensor.

Each branch of the measuring bridge is made up of a single magnetoresistive electrode whose width must be sufficient to react to the relatively small magnetic fields generated by the scale. The resistance of the branches of the bridge is thus small, and large currents flow through the measuring bridges. This device therefore has a high electricity consumption.

The patent EP 0 624 778 (Heidenhain) describes a measuring device comprising two bridges of magnetoresistive electrodes, each bridge comprising four branches. Each bridge branch is made up of maximally two magnetoresistive electrodes (see FIG. 3d). The electrical resistance of the branches of the bridge obtainable with this arrangement remains low. This document does not suggest any solution for disposing and connecting magnetoresistive electrodes in such a way as to reduce further the consumption of electricity, so the sensor described is unsuitable for use in an electrically self-powered, portable apparatus, for example in a portable caliper.

The patent U.S. Pat. No. 5,036,276 (Seiko Epson) describes another sensor with magnetoresistive electrodes whose electrodes are connected in such a way as to define four measuring bridges phase-shifted by $\pi/4$. Each branch of the bridge is formed by a single magnetoresistive electrode. The total resistance of the sensor thus corresponds to that of the four bridges in parallel, with the branches comprising a single electrode, and is particularly low so that the use of the sensor is limited to devices for which the electricity consumption is not crucial.

SUMMARY OF THE INVENTION

One object of the invention is to create a magnetoresistive sensor for devices for measuring length and/or angle which is improved with respect to the prior art. In particular, an object of the present invention is to create a magnetoresistive sensor which makes possible high precision measurements with a high degree of sensitivity and a low electricity consumption. Another object is to create a magnetoresistive sensor which can easily be incorporated into an existing measuring device.

According to the invention, these objects are attained by means of a sensor intended to be moved with respect to a magnetized scale with a period $\lambda$ for measuring linear or angular dimensions, equipped with magnetoresistive electrodes connected so as to form n measuring bridges, each measuring bridge being formed by four sets of magnetoresistive electrodes, the magnetoresistive electrodes making up each set being connected in series, the magnetoresistive electrodes being distributed longitudinally so as to constitute x groups each made up of y consecutive magnetoresistive electrodes coming from maximally two sets of the same measuring bridge, wherein the number y of magnetoresistive electrodes per group is greater than eight.

As will become clearer when reading about the example embodiment given in the specification, this particular rule for arranging and connecting the magnetoresistive electrodes with respect to one another enables measuring bridges to be created, each branch of which is made up of a large number of magnetoresistive electrodes connected in series, for example eight magnetoresistive electrodes connected in series. The total resistance of the bridges is thus greatly increased, which allows the electricity consumption to be reduced to a level sufficient for use in a battery-powered device such as a caliper. Moreover, the resolution is not affected.

BRIEF DESCRIPTION OF THE DRAWINGS

The invention will be better understood from reading the description given by way of example and illustrated by the following figures.

DESCRIPTION OF THE INVENTION

Figure 1:
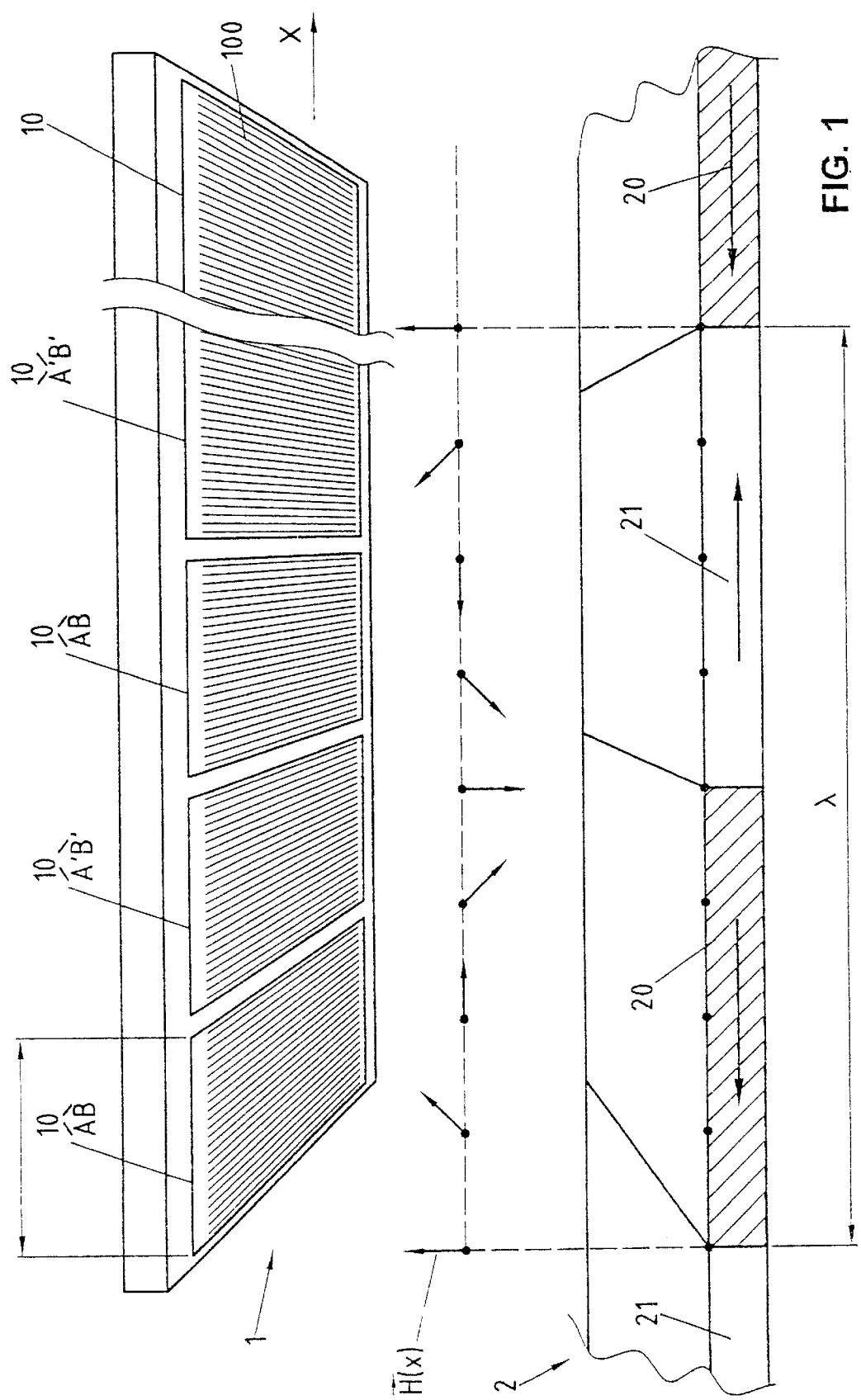
FIG. 1 represents a schematic view in perspective of a scale portion and a sensor portion, several groups of magnetoresistive electrodes being visible on the sensor portion, the figure illustrating moreover the magnetic field H produced by the scale portion on the sensor portion.

FIG. 1 illustrates diagrammatically a sensor portion 1 above a scale portion 2. The scale has a periodic magnetization according to the x and −x horizontal direction. The magnetization period, or scale period, equals λ, that is to say, the length of segments 20, 21 magnetized in a predetermined direction equals λ/2.

The scale 2 is preferably fixed with respect to the body of the measuring device, whereas the magnetoresistive sensor 1 can be moved at a small distance above the scale. In the case where the measuring device constitutes a measuring column or a caliper, the scale 2 is integral with the frame of the device, whereas the sensor 1 is connected to a slide able to slide along the frame or the scale. The length of the sensor is typically on the order of some centimeters versus several tenths of centimeters for the scale. Other arrangements, in particular a reversal of the scale and the sensor, are also possible. In the case of a device for measuring angles or the rotation of a shaft, the scale can be made up of an array of electrodes on the periphery of a shaft, and the sensor placed inside a cylindrical ring around this shaft.

The scale can be achieved, for example, by means of a band of aluminum on which a material is placed having a high magnetic coercivity (ferrites). On the surface of the scale, the horizontal magnetic field $H_x(x)$ is a practically rectangular function of the longitudinal position x: $H_x(x)=H_0$ for x included between $\{0-\lambda/2\}$ modulo λ, and $H_x(x)=-H_0$ for x included between $\{\lambda/2-\lambda\}$ modulo λ. At a sufficient distance a from the scale, it can easily be shown that the magnetic field $H_x(x)$ is a sinusoidal function of the position x, the approximation of the sine improving when the distance a increases. The direction of the vector of the magnetic field $H_x(x)$ between the scale and the sensor is illustrated by arrows in FIG. 1.

The magnetic field $H_0$ at the surface of the scale is preferably included in the interval of 10 to 100 kA/m and decreases exponentially to the distance a of the surface according to the ratio:

$$H_x(a)=H_0 \cdot e^{-2\pi a/\lambda}$$

It is mechanically difficult to achieve a system of measurement with a sensor which moves very close to the scale. The cost of the device thus represents a certain constraint on the distance a between the sensor and the scale. The prior art magnetoresistive devices have therefore been limited to costly devices such as height-measuring columns, machine tools or optical microscopes, for example. For this type of devices, it is possible to use mechanics sufficiently precise to allow the sensor to be moved at a distance on the order of 0.1 millimeter from the scale. It will be shown later on that the sensor according to the invention can function at a distance from the scale on the order of 200 to 700 μm, preferably at 500 μm, which enables it to be used in portable devices of the caliper type.

When the distance a between the scale and the sensor equals the half period of the scale λ/2, the magnetic field H(a) already represents only 4% of the value of the field $H_0$ at the surface of the scale. It is therefore necessary to use a sufficient scale period λ to get a magnetic field sufficient on the sensor 1. On the other hand, by reducing λ, one improves the sinusoidal shape of the magnetic field $H_x(x)$ gathered at a distance a. The scale period λ chosen is thus necessarily a compromise. Trials have shown that for the distance a indicated above, optimal results are obtained with a value for λ of between 0.5 and 1.5 millimeters, preferably 1 millimeter.

Figure 4:
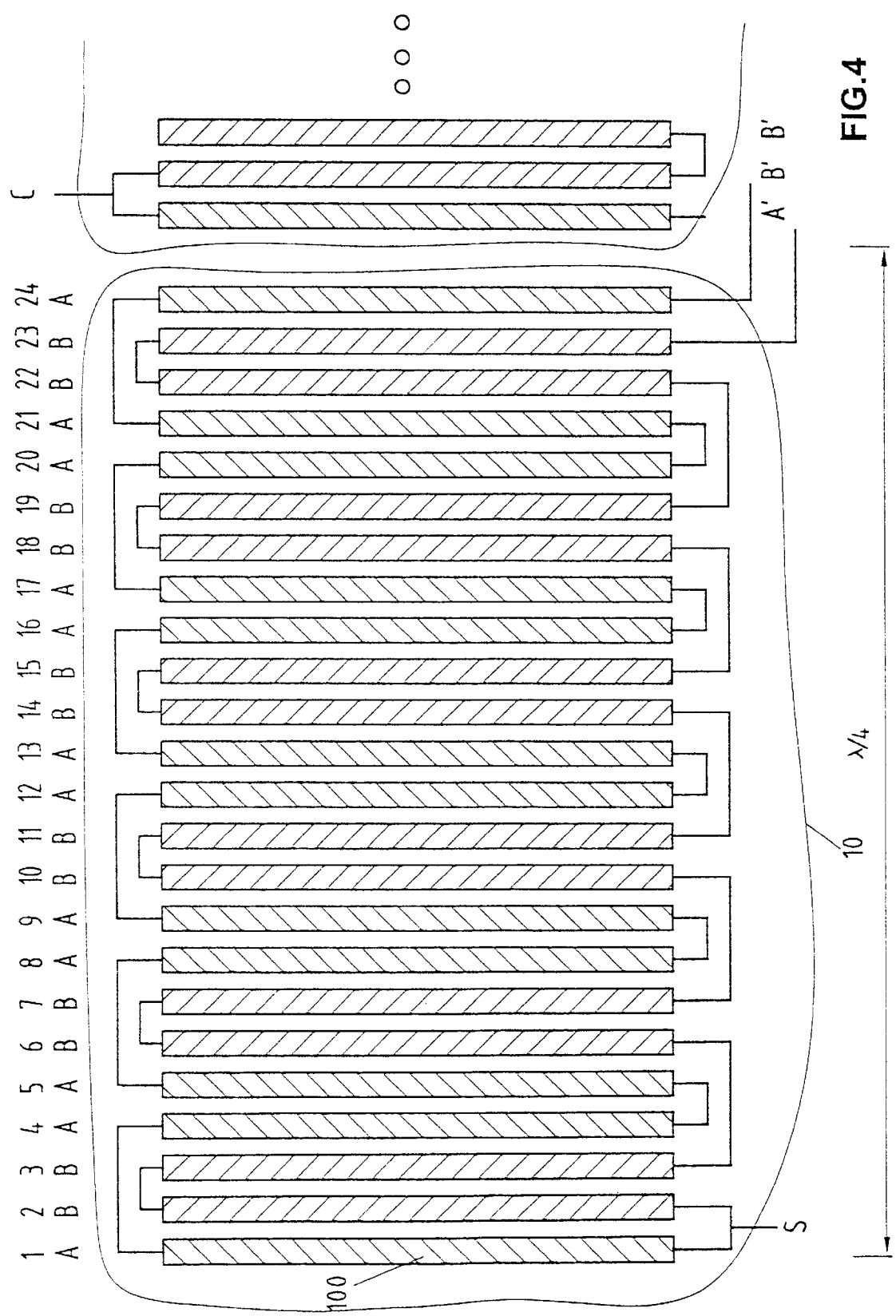
FIG. 4 illustrates diagrammatically the arrangement of the magnetoresistive electrodes within a group.

The sensor 1 is equipped with magnetoresistive electrodes 100 (visible in particular in FIG. 4). The magnetoresistive electrodes are provided with barber-pole structures, that is fine parallel bands of conductor material inclined at about +/−45° with respect to the axis of the electrodes. Half the electrodes are provided with barber-poles oriented at +45° whereas the other half are provided with barber-poles oriented at −45°. It is possible to show that an identical magnetic field H produces on a magnetoresistive electrode provided with a barber-pole structure oriented at +45° a variation of resistance Ar opposite to that produced on a magnetoresistive electrode provided with a barber-pole structure oriented at −45°.

Figure 3:
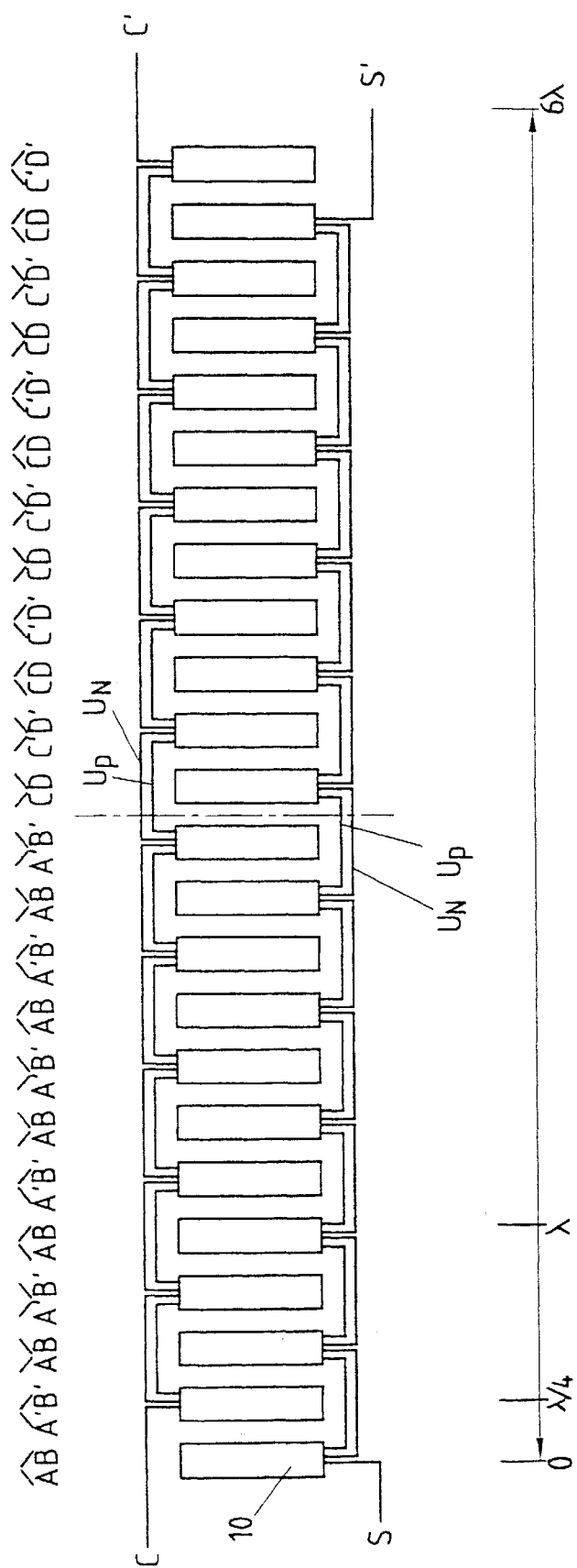
FIG. 3 illustrates diagrammatically the spatial distribution of the magnetoresistive electrodes of the sensor in groups.

The magnetoresistive electrodes 100 are distributed longitudinally on the sensor 1 in such a way as to constitute x groups 10, in this example 24 groups of consecutive electrodes, of which only some have been illustrated in FIG. 1. The arrangement of the 24 groups of magnetoresistive electrodes is illustrated in FIG. 3. Each group is made up of y magnetoresistive electrodes 100 spread out on a length w, in this example 24 electrodes spread out on a length w equal to λ/4, that is 0.25 millimeters. The total number of magnetoresistive electrodes 100 on the sensor 1 is thus equal to x·y=24·24=576. Since two successive groups are phase-shifted by λ/4, the phase shift between the signals received by two successive groups is 90°.

Figure 2:
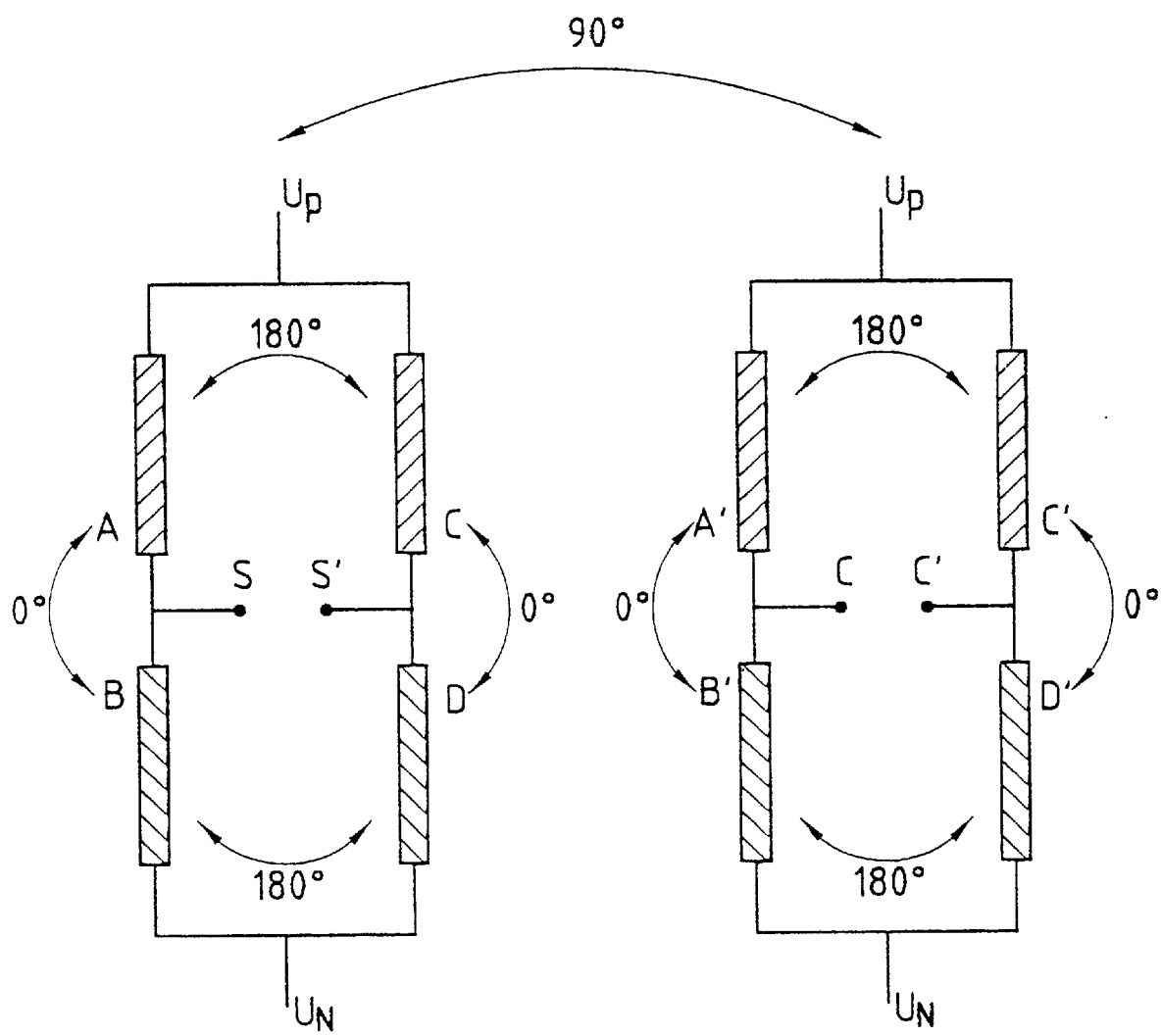
FIG. 2 shows an electrical diagram illustrating the way in which the different scale electrodes are connected so as to constitute two measuring bridges.

FIG. 2 illustrates the way in which the different magnetoresistive electrodes 100 on the sensor are connected so as to define two measuring bridges. Each measuring bridge comprises four branches, each branch being made up of a set of magnetoresistive electrodes ABCD, respectively A'B'C'D'. The two measuring bridges are fed between voltages $U_P$ and $U_N$. Each set of electrodes A, B, C, D, A', B', C', D' is made up, in this example, of 72 electrodes connected in series. If the magnetoresistive electrodes 100 have a length of about 1 millimeter and a width on the order of 5 μm, it is possible to obtain with the usual magnetoresistive materials, a resulting high resistance, greater than 10 kΩ, preferably greater than 50 kΩ, for each set of magnetoresistive electrodes and thus for each bridge. The currents flowing through the two measuring bridges are thus very weak, which allows electricity consumption to be limited with respect to prior art devices and to power the sensor by battery, for example.

The four sets A', B', C', D' of the second bridge A'B'C'D' come from 12 odd-numbered groups, that is occupying positions along the sensor equal to λ/2, 3λ/2, etc. The four sets A, B, C, D of the first bridge ABCD, on the other hand, come from 12 even-numbered groups, that is occupying positions along the sensor equal to 0, λ, etc. The signal received at the output CC' of the second bridge is thus phase-shifted by 90° with respect to the signal received at the output SS' of the first bridge.

The following table summarizes the composition of the different sets of electrodes A, B, C, D of the first bridge and A', B', C', D' of the second bridge:

| Set of 1st bridge | Phase | Orientation of barber-poles | Set of 2nd bridge | Phase | Orientation of barber-poles |
| --- | --- | --- | --- | --- | --- |
| A | 0° | +45° | A' | 90° | +45° |
|   | 180° | −45° |   | 270° | −45° |
| B | 0° | −45° | B' | 90° | −45° |
|   | 180° | +45° |   | 270° | +45° |
| C | 0° | −45° | C' | 90° | −45° |
|   | 180° | +45° |   | 270° | +45° |
| D | 0° | +45° | D' | 90° | +45° |
|   | 180° | −45° |   | 270° | −45° |

Each set of electrodes is made up of a half-set of 36 magnetoresistive electrodes occupying the first positions of the same phase and provided with barber-pole structures oriented according to a first direction, and by a second half-set of 36 other electrodes occupying the positions phase-shifted by 180° with respect to the first positions and provided with barber-pole structures oriented according to a second direction. The variation in resistance caused by the magnetic field $H_x(x)$ on the two half-sets is thus the same for a given position x of the sensor.

The set of electrodes B comes from the same groups as the set of electrodes A, the orientation of the barber-pole structures being however opposite. In the same way, the sets B', D and respectively D' come from the same groups as the sets A', C and respectively C', the orientation of the barber-pole structures being in each case opposite. The voltage dividers AB, CD and A'B', C'D' of each measuring bridge are thus made up of magnetoresistive electrodes coming from the same portion of the sensor; local variations in magnetization of the scale are therefore compensated for within each measuring bridge.

The electrodes of the set C occupy positions phase-shifted by 180° with respect to electrodes of set A, and share the same orientation of barber-pole structures. The same applies to the electrodes of the sets D, C' and respectively D' with respect to those of sets B, A' and respectively B'. This arrangement is especially visible in FIG. 3, in which the two letters and the two symbols / and \ indicate above each group the sets of electrodes which constitute it as well as the orientation of barber-pole structures chosen. The barber-pole structures are moreover indicated directly on the electrodes of the group shown in FIG. 4.

Figure 5:
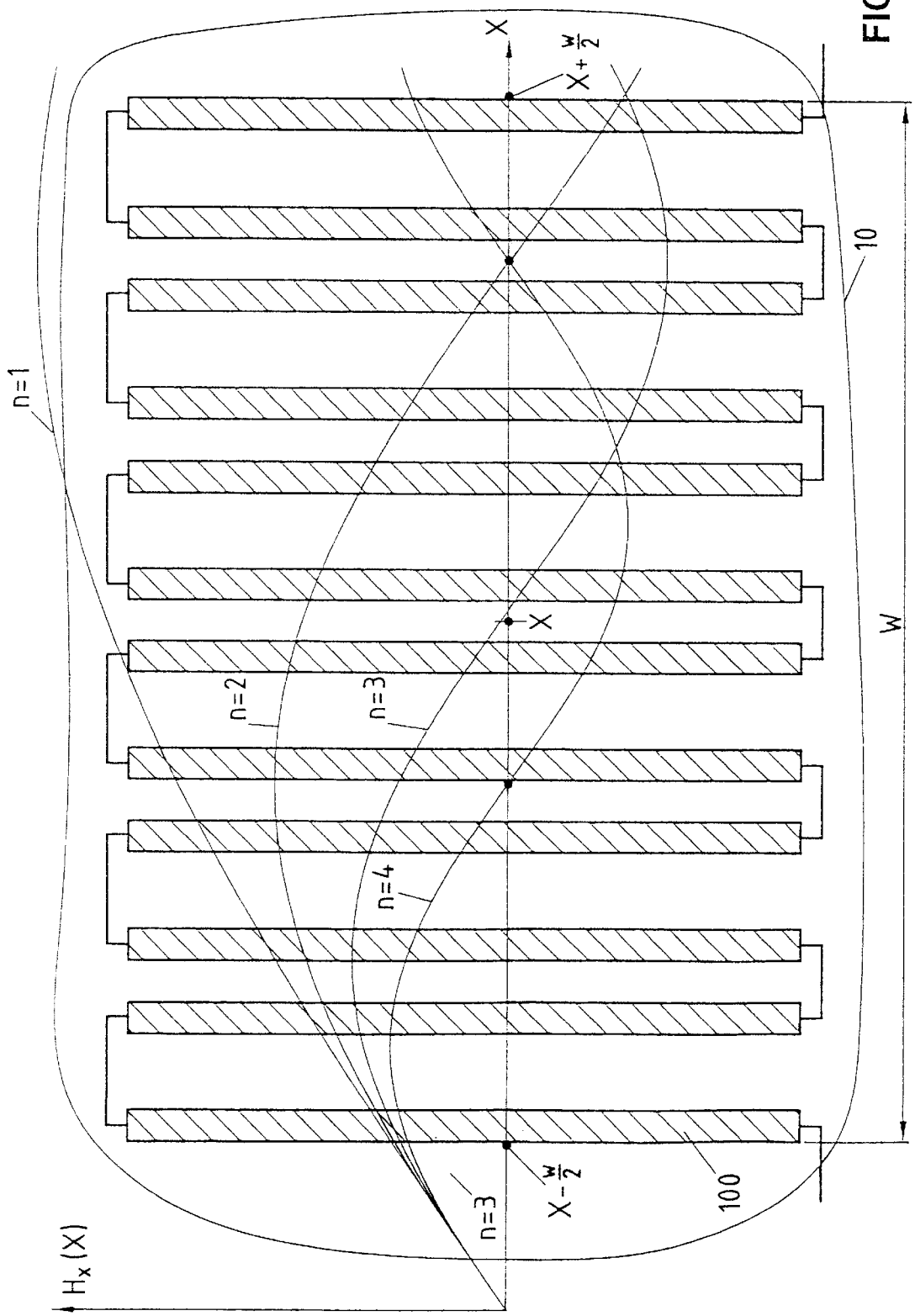
FIG. 5 illustrates diagrammatically the effect of averaging obtained thanks to the groups of electrodes.

The resistance of each magnetoresistive electrode is a function of the magnetic field $H_x(x)$ applied. We have seen that at a sufficient distance a (here 0.5 millimeter), $H_x(x)$ is only approximately a sine function, and thus contains harmonics. The resistance R(x) of each magnetoresistive electrode 100 therefore varies in an approximately sinusoidal way when the sensor 1 moves into the magnetic field generated by the scale 2. The resistance of each set of electrodes 100 in one of the bridges ABCD or A'B'C'D' is equal to the sum of the resistance of the 72 electrodes connected in series which constitute this set. These 72 electrodes are distributed into 6 groups which occupy positions of identical phase (or phase-shifted by 180°, but with an opposite orientation of barber-poles). FIG. 5 represents the 12 magnetoresistive electrodes of the same group 10 and of the same set as well as the four principle harmonics n=1 to n=4 of the field $H_x$, produced by the scale on each of these 12 electrodes. The resistance R(x) of each set of electrodes A to D' is equal to the resistance of 12 magnetoresistive electrodes 100 spread out on the width w around the position x (modulo λ/2), multiplied by six (six groups per set). The resistance of a set of electrodes therefore takes into account the value of $H_x(x)$ between the positions [X−w/2; X+w/2]. It can be seen from the drawing, and it is easily possible to show that this averaging allows the harmonics of $H_x(x)$ to be greatly attenuated on a length as large as w=λ/4, the positive and negative components of the high order harmonics compensate themselves. This averaging thus enables the precision of measurement to be improved. The attenuation of the harmonics depends upon the number of electrodes upon which the averaging is made: in this example, when the groups are made up of 24 electrodes distributed on w=λ/4, the attenuation of the harmonic n=3 equals about 10 dB.

For a given scale period X and an electrode width imposed by technology, it is thus advantageous to use groups made up of a large number of magnetoresistive electrodes in order to increase the spread w of the groups and thus to improve the averaging of the signal and the reduction of the harmonics.

The increase of the number of electrodes per group can likewise result from the simultaneous increase of the spread w of the groups and of the scale pitch λ. In this case, without disturbing the sinusoidal shape of $H_x(x)$ at the distance a, the increase of λ enables the value of the magnetic field $H_x$ to be increased to the level of the magnetoresistive electrodes, and thus increases their sensitivity.

By keeping w and λ constants, the increase of the number y of electrodes per group can be carried out by reducing their width (within the limits of the technology applied). One thus manages to increase their resistivity, which allows the electricity consumption of the sensor to be reduced. Since reduction of the width of the electrodes is compensated by the increase in their number, this action has no tangible consequence on the sensitivity of the device.

According to the invention, the number y of electrodes per group is therefore deliberately large, in any case greater than 8, and 24 in the example illustrated. To make up two measuring bridges, 8 sets of electrodes are needed, which must come from (at least) four groups. In the case where it is decided that n=2 measuring bridges are to be used, a number x is chosen for the groups which is a multiple of 4, for example 4, 8, 12, 16, 20, 24, 32, 36, 40 or 48. If one wishes to use half-sets of electrodes, that is sets made up of electrodes with two opposite orientations of barber-pole structures, one is limited to values which are multiples of 8.

FIG. 4 illustrates, by way of example, a group 10 of magnetoresistive electrodes 100 coming from a first set A with barber-pole structures oriented at +45° and a second set B with barber-pole structures oriented at −45°. It will be noted that the sequence chosen ABBAABBABB . . . , etc., ensures, on the one hand, that the center of gravity of the electrodes of two sets, here A and B, in the same group is superimposed, and, on the other hand, ensures that all the electrodes are connected to one another in a single plane, without crossings. As illustrated in FIG. 3, the electrodes A, respectively B, of this group are connected in series with the electrodes A, respectively B, of a group spaced at $\lambda/2$, and are provided with barber-pole structures oriented at $-45°$, respectively $+45°$. No bridge or crossing is necessary to connect the groups 10 to one another.

One skilled in the art will be able to use this invention in a number of variants adapted to his various needs. In particular, the number n of measuring bridges used can differ from 2; the measurements can also be made with a single measuring bridge, or with three bridges phase-shifted by 120°, for example. In this last case, it is possible, for example, to have groups of electrodes spread out on the lengths w equal to $\lambda/3$, and to have them thus comprise even more electrodes. In addition, by using barber-pole structures oriented at angles other than $+/-45°$; it is possible to gain a great deal of freedom in distributing the groups 10 on the sensor and the electrodes 100 within the groups 10. Finally it will likewise be noted that the groups of electrodes can also be made up of electrodes coming from a single set rather than from two intermixed sets.

What is claimed is:

1. A sensor intended to be moved with respect to a magnetized scale with a period $\lambda$ for measuring linear or angular dimensions, said sensor comprising:

magnetoresistive electrodes connected to form n measuring bridges, each said measuring bridge being formed by four branches of magnetoresistive electrodes, the magnetoresistive electrodes making up each branch of said bridge being connected in series, the magnetoresistive electrodes being distributed longitudinally so as to constitute x groups, each said group being made up of y consecutive magnetoresistive electrodes coming from maximally two of said branches of a same said measuring bridge, wherein the number of magnetoresistive electrodes per group is greater than eight.

2. The sensor according to claim 1, wherein at least certain magnetoresistive electrodes bear barber-pole structures.

3. The sensor according to claim 2, wherein the magnetoresistive electrodes of said groups come from two branches of said bridge and the centers of gravity of two branches of said bridge of magnetoresistive electrodes in a same group and their barber-pole structures are selected so that a same magnetic field coming from the scale induces an opposite resistance variation in the two branches of said bridge of magnetoresistive electrodes.

4. The sensor according to claim 3, wherein each said group includes a sequence with one magnetoresistive electrode of first branch in said group, two electrodes of the other branch in said group, two electrodes of the first branch in said group, and continuing.

5. The sensor according to claim 4, wherein the consecutive groups are phase shifted by $180°/n$.

6. The sensor according to claim 5, wherein each measuring bridge is made up of four branches of magnetoresistive electrodes coming from pairs of groups phase-shifted by 180°.

7. The sensor according to claim 1, wherein each branch of said bridge has magnetoresistive electrodes coming from at least two groups of the same phase.

8. The sensor according to claim 2, wherein each branch of said bridge has magnetoresistive electrodes coming from at least two groups phase-shifted by 180° and provided with barber-pole structures with opposite orientations.

9. The sensor according to claim 1, wherein the number n of measuring bridges is equal to two, and the number x of groups is a whole-number multiple of eight, and the magnetoresistive electrodes of each branch of said bridge come from at least two first groups of the same phase and with a barber-pole structure oriented in a first direction, and at least two second groups phase-shifted by 180° with respect to said first groups and with a barber-pole structure oriented in a second direction, opposite to the first direction.

10. The sensor according to claim 9, wherein each measuring bridge is made up of four branches of said bridge of magnetoresistive electrodes, all the magnetoresistive electrodes of two branches being distributed in the first half of the electrodes whereas all the electrodes of two other branches are distributed in the second half of the electrodes.

11. The sensor according to claim 10, wherein the number x of groups is equal to 24.

12. The sensor according to claim 11, wherein the number y of magnetoresistive electrodes per group is equal to 24.

13. The sensor according to claim 1, wherein the period $\lambda$ is included in the interval $\{0.5 \text{ mm}; 1.5 \text{ mm}\}$.

14. The sensor according to claim 13, wherein the resulting resistance of each branch of magnetoresistive electrodes is greater than 10 K$\Omega$.

15. The sensor according to claim 14, wherein the magnetoresistive electrodes are distributed on at least four times the length of the period $\lambda$.

16. A device for measuring dimension comprising a magnetized scale with a period of magnetization $\lambda$ and a sensor moving with respect to said scale, said sensor having magnetoresistive electrodes connected to form n measuring bridges, each said measuring bridge being formed by four branches of magnetoresistive electrodes, the magnetoresistive electrodes making up each branch of said bridge being connected in series, the magnetoresistive electrodes being distributed longitudinally so as to constitute x groups each made up of y consecutive magnetoresistive electrodes coming from maximally two branches of a same measuring bridge, wherein the number of magnetoresistive electrodes per group is greater than eight.

17. The measuring device according to claim 16, wherein the distance between the scale and the magnetoresistive electrodes is included in the interval $\{200 \mu m - 700 \mu m\}$.

18. The device according to claim 16, wherein it is battery-powered.

19. A sensor for measuring linear or angular dimensions, said sensor comprising:

a plurality of measuring bridges for making high precision measurements;

a plurality of magnetoresistive electrodes for forming said plurality of measuring bridges and providing resistance;

at least four branches of said plurality of measuring bridges, each said branch arranging said plurality of magnetoresistive electrodes in series connection for increasing resistance; and a plurality of groups, each said plurality of groups having some of said plurality of magnetoresistive electrodes from two of said at least four branches of said plurality of measuring bridges.

20. The sensor according to claim 19, wherein said some of said plurality of magnetoresistive electrodes have barber-pole structures of magnetic fields slanted one way and said some of said plurality of magnetoresistive electrodes have barber-pole structures of magnetic fields slanted the other way.

* * * * *